US011602064B2

(12) United States Patent
Gunaji et al.

(10) Patent No.: US 11,602,064 B2
(45) Date of Patent: Mar. 7, 2023

(54) DYNAMIC ELECTRICAL AND FLUID DELIVERY SYSTEM WITH INDEXING MOTION FOR BATCH PROCESSING CHAMBERS

(71) Applicant: Applied Materials, Inc., Santa Clara, CA (US)

(72) Inventors: Akshay Gunaji, Karnataka (IN); Uday Pai, San Jose, CA (US); Timothy J. Roggenbuck, Beaverton, OR (US); Sanjeev Baluja, Campbell, CA (US); Kalesh Panchaxari Karadi, Karnataka (IN); Tejas Ulavi, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 394 days.

(21) Appl. No.: 17/009,652

(22) Filed: Sep. 1, 2020

(65) Prior Publication Data

US 2022/0071037 A1 Mar. 3, 2022

(51) Int. Cl.
*H05K 5/02* (2006.01)
*C23C 16/455* (2006.01)
*H02G 3/04* (2006.01)
*C23C 16/458* (2006.01)

(52) U.S. Cl.
CPC ....... *H05K 5/0247* (2013.01); *C23C 16/4588* (2013.01); *C23C 16/45544* (2013.01); *H02G 3/0437* (2013.01); *C23C 16/4586* (2013.01)

(58) Field of Classification Search
CPC .......... C23C 16/4588; C23C 16/45544; C23C 16/4586; H02G 3/0437; H05K 5/024
See application file for complete search history.

(56) References Cited

U.S. PATENT DOCUMENTS

| 6,416,647 | B1 * | 7/2002 | Dordi ................ H01L 21/67051 |
| | | | 204/278 |
| 7,614,939 | B2 | 11/2009 | Tolles et al. |
| 9,623,555 | B2 | 4/2017 | Krupyshev et al. |
| 2010/0086380 | A1 * | 4/2010 | Kurita ............... H01L 21/68742 |
| | | | 414/217 |
| 2014/0150592 | A1 | 6/2014 | Kremerman |
| 2016/0329234 | A1 | 11/2016 | Krupyshev et al. |
| 2020/0016755 | A1 | 1/2020 | Harada et al. |
| 2020/0101598 | A1 | 4/2020 | Caveney |

FOREIGN PATENT DOCUMENTS

| CN | 100576986 | * 11/2004 |
| CN | 102160167 A | 8/2011 |
| JP | 2001287188 A | 10/2001 |

OTHER PUBLICATIONS

CN_100576986, Ray, Nov. 2004—English translation (Year: 2004).*
PCT International Search Report and Written Opinion in PCT/US2021/048685 dated Dec. 23, 2021, 10 pages.

* cited by examiner

*Primary Examiner* — Joseph A Miller, Jr.
(74) *Attorney, Agent, or Firm* — Servilla Whitney LLC

(57) ABSTRACT

Process assemblies and cable management assemblies for managing cables in tight envelopes. A processing assembly includes a top chamber having at least one substrate support, a support shaft, a robot spindle assembly, a stator and a cable management system. The cable management system includes an inner trough assembly and an outer trough assembly configured to move relative to one another, and a plurality of chain links configured to house at least one cable for delivering power to the process assembly.

20 Claims, 13 Drawing Sheets

DYNAMIC ELECTRICAL AND FLUID DELIVERY SYSTEM WITH INDEXING MOTION FOR BATCH PROCESSING CHAMBERS

TECHNICAL FIELD

Embodiments of the disclosure generally relate to electrical and fluid delivery systems for rotating assemblies of batch processing chambers. In particular, embodiments of the disclosure are directed to modular electrical and/or fluid delivery systems that improve electrical and fluid line longevity.

BACKGROUND

In some chamber designs for atomic layer deposition (ALD) or chemical vapor deposition (CVD) processing, precursors and gases are delivered to a large substrate support or multiple substrate support surfaces through multiple gas distribution plates at the same time. The gas distribution plates are spaced from the substrate surfaces, or vice versa, forming one or more operational gaps. Such chambers can be highly sensitive to the consistency and uniformity of the gaps between different process stations and over time as the chamber is used. With gaps of about one millimeter for some multi-station deposition systems, the processes performed in the separate stations can be highly susceptible to small gap deviations.

The substrates supports for some processing chambers use a motor assembly with a shaft and at least one support surface. The shaft extends through a bottom of the processing chamber and maintains the support surfaces.

Conventional single and multi-wafer processing chambers often employ complex configurations for delivering current and fluid to rotating components such as slip rings, moving cables, and feed through mechanism. Such configurations tend to be prone to failure in processing chambers having tight envelopes and long processing times.

Therefore, there is a need in the art for apparatus and methods for managing cables and fluid delivery channels through tight envelopes.

SUMMARY

One or more embodiments of the disclosure are directed to cable management systems comprising an outer trough assembly and an inner trough assembly. The outer trough assembly comprises an outer trough boundary with a semi-cylindrical shape with a central axis, an inner surface and an outer surface. An outer guide has a semi-cylindrical shape with a central axis, an inner surface and an outer surface. The central axis of the outer guide is coaxial with the central axis of the outer trough boundary.

The inner trough assembly is positioned within the outer trough assembly. The inner trough assembly comprises a bottom plate with a top surface and a bottom surface. A base has a top surface and bottom surface that is connected to the top surface of the bottom plate. A semi-cylindrical inner guide is connected to the base and has an inner surface and an outer surface. The semi-cylindrical inner guide has an axis normal to the base. A mounting bracket has a top portion and a bottom portion connected to the base, an inner surface and an outer surface. The top portion has a connector plate and a shaft coupling configured to receive a hollow support shaft. A channel is formed between the inner surface of the outer guide of the outer trough assembly and the inner surface of the outer surface of the mounting bracket.

Additional embodiments of the disclosure are directed to processing assemblies comprising a top chamber with at least one substrate support. A support shaft has a top end and a bottom end. The top end extends through the top chamber and is connected to the substrate support. A robot spindle assembly is connected to the top chamber. An outer guide has a semi-cylindrical shape with a central axis, an inner surface and an outer surface. The central axis of the outer guide is coaxial with the central axis of the outer trough boundary.

An inner trough assembly is positioned within the outer trough assembly and comprises a bottom plate having a top surface and a bottom surface, a base having a top surface and bottom surface. The bottom surface of the base is connected to the top surface of the bottom plate. A semi-cylindrical inner guide is connected to the base. The semi-cylindrical inner guide has an inner surface and an outer surface and an axis normal to the base.

A mounting bracket with a top portion and a bottom portion is connected to the base. The mounting bracket has an inner surface and an outer surface. The top portion has a connector plate and a shaft coupling configured to receive a hollow support shaft. A stator is connected to a stator bracket. The stator bracket is connected to the outer trough boundary of the outer trough assembly. A channel is formed between the inner surface of the outer guide of the outer trough assembly and the inner surface of the outer surface of the mounting bracket.

Further embodiments of the disclosure are directed to cable management systems comprising an outer trough assembly and an inner trough assembly. The outer trough assembly comprises an outer trough boundary with a semi-cylindrical shape with a central axis, an inner surface and an outer surface. An outer guide has a semi-cylindrical shape with a central axis, an inner surface and an outer surface. The central axis of the outer guide is coaxial with the central axis of the outer trough boundary.

The inner trough assembly is positioned within the outer trough assembly. The inner trough assembly comprises a bottom plate with a top surface and a bottom surface. A base has a top surface and bottom surface. The bottom surface of the base is connected to the top surface of the bottom plate. A semi-cylindrical inner guide is connected to the base and has an inner surface and an outer surface. The semi-cylindrical inner guide has an axis normal to the base.

A mounting bracket with a top portion and a bottom portion connected to the base, an inner surface and an outer surface. The top portion has a connector plate and a shaft coupling configured to receive a hollow support shaft. A hollow shaft extends form the shaft coupling.

A stator bracket is connected to the outer guide and to the outer trough boundary. A stator is positioned on the stator bracket, and a rotor is positioned around the stator and is connected to the inner trough assembly. The rotor and stator are configured to cooperatively interact to cause the inner trough assembly to rotate within the outer trough assembly. A plurality of chain links are configured to receive at least one cable within.

A rotary fluid union is within the mounting bracket and is configured to deliver fluid to a plurality of fluid tubes extending through the cavity of the shaft. A channel is formed between the inner surface of the outer guide of the outer trough assembly and the inner surface of the outer surface of the mounting bracket. The outer trough assembly further comprises a semi-circular base plate connected to a bottom of the semi-cylindrical boundary. The inner trough assembly further comprises a hard stop disposed on an outer surface of the shaft coupling. The hard stop is configured to limit rotation of the inner trough assembly relative to the outer trough assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure advantageously provide for a support plate for a cable management assembly configured to manage cables and fluid delivery channels through tight envelopes. Further embodiments provide for a processing assembly comprising a top chamber, a support shaft, a robot spindle assembly, a stator and a cable management system.

Figure 1:
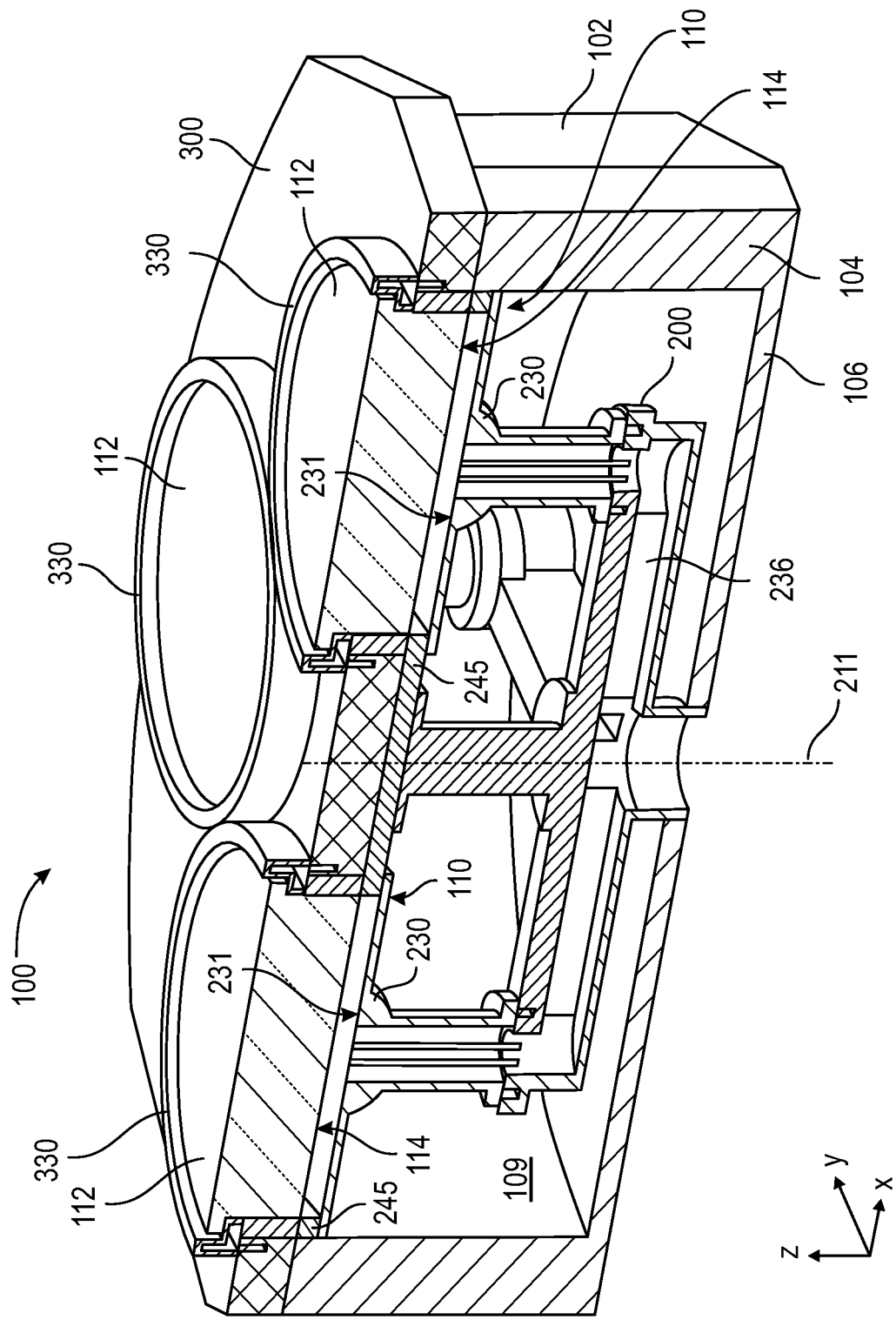
FIG. 1 shows a cross-sectional isometric view of a processing chamber in accordance with one or more embodiments of the disclosure.
Figure 2:
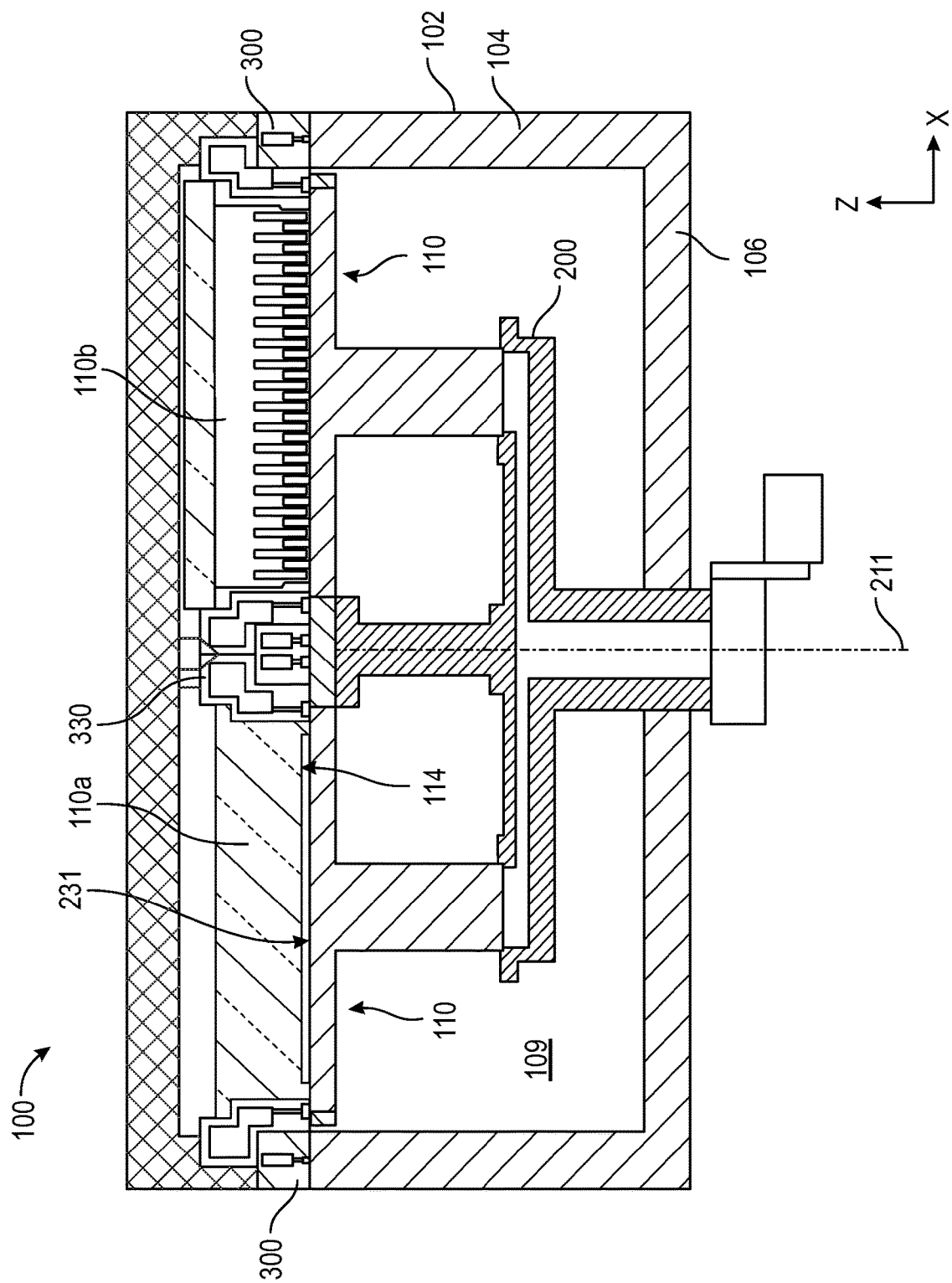
FIG. 2 shows a cross-sectional view of a processing chamber in accordance with one or more embodiments of the disclosure.
Figure 3A:
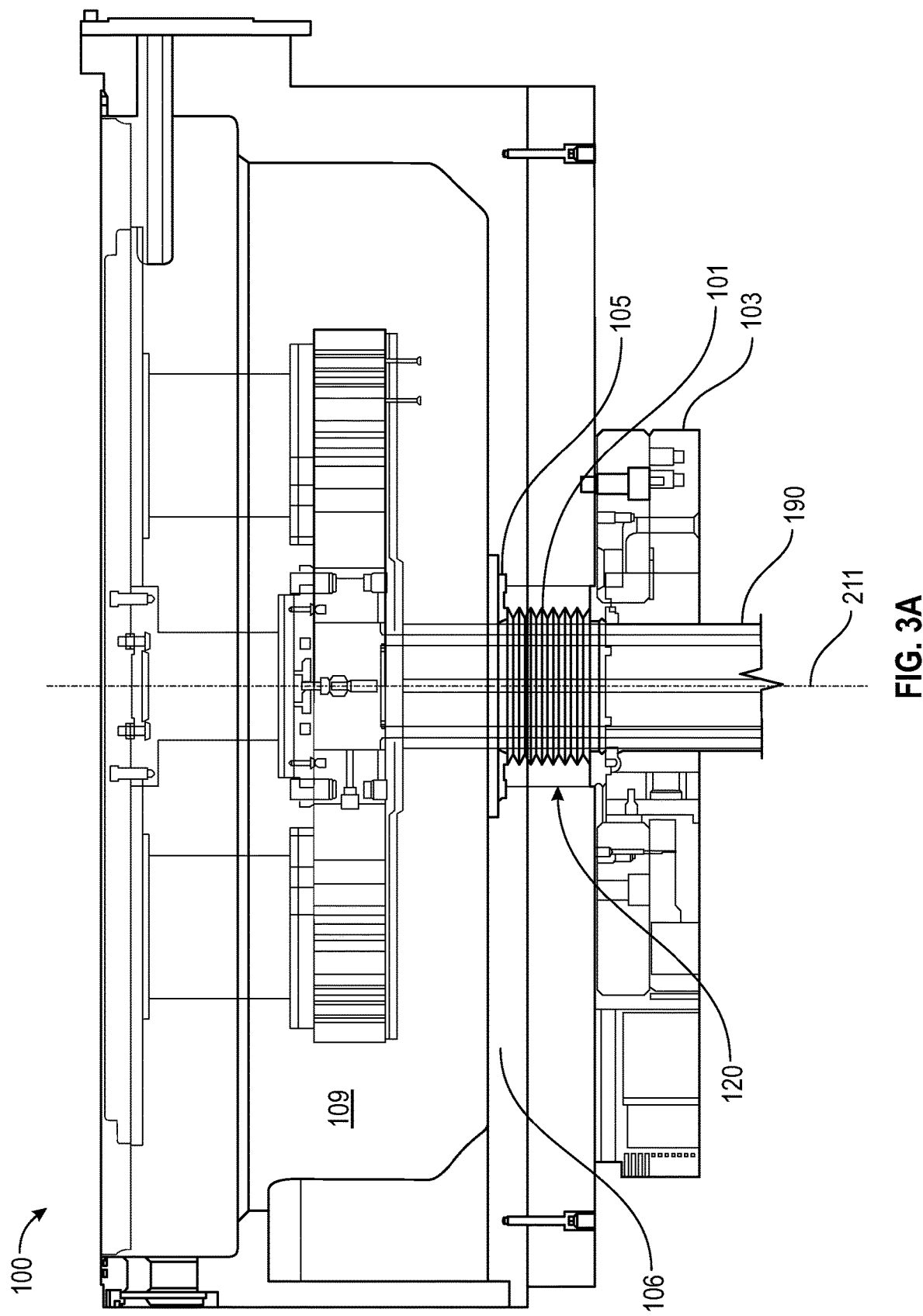
FIG. 3A shows a cross-sectional view of a processing chamber in accordance with one or more embodiments of the disclosure.
Figure 3B:
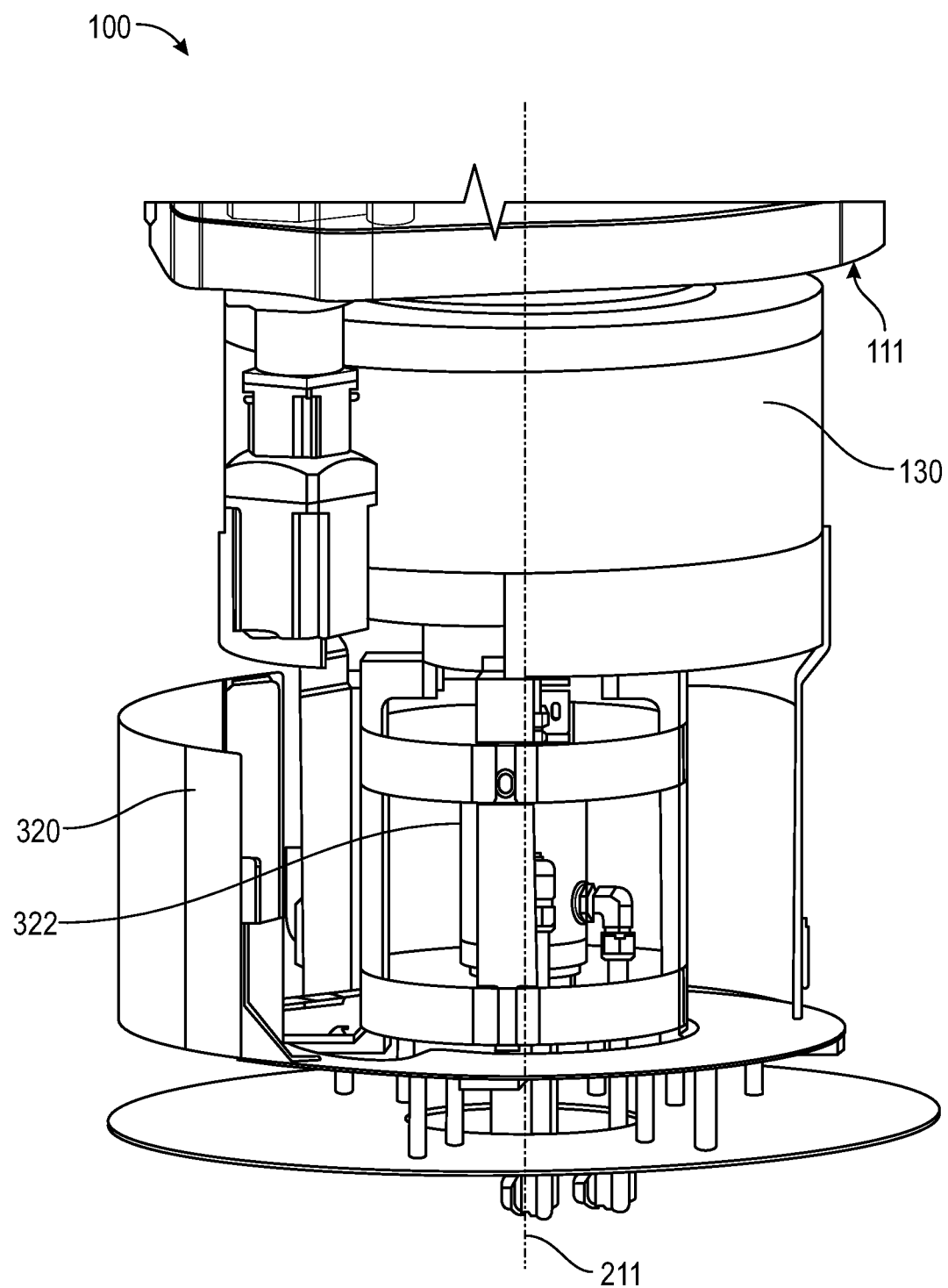
FIG. 3B shows a perspective view of a processing assembly in accordance with one or more embodiments of the disclosure.
Figure 3C:
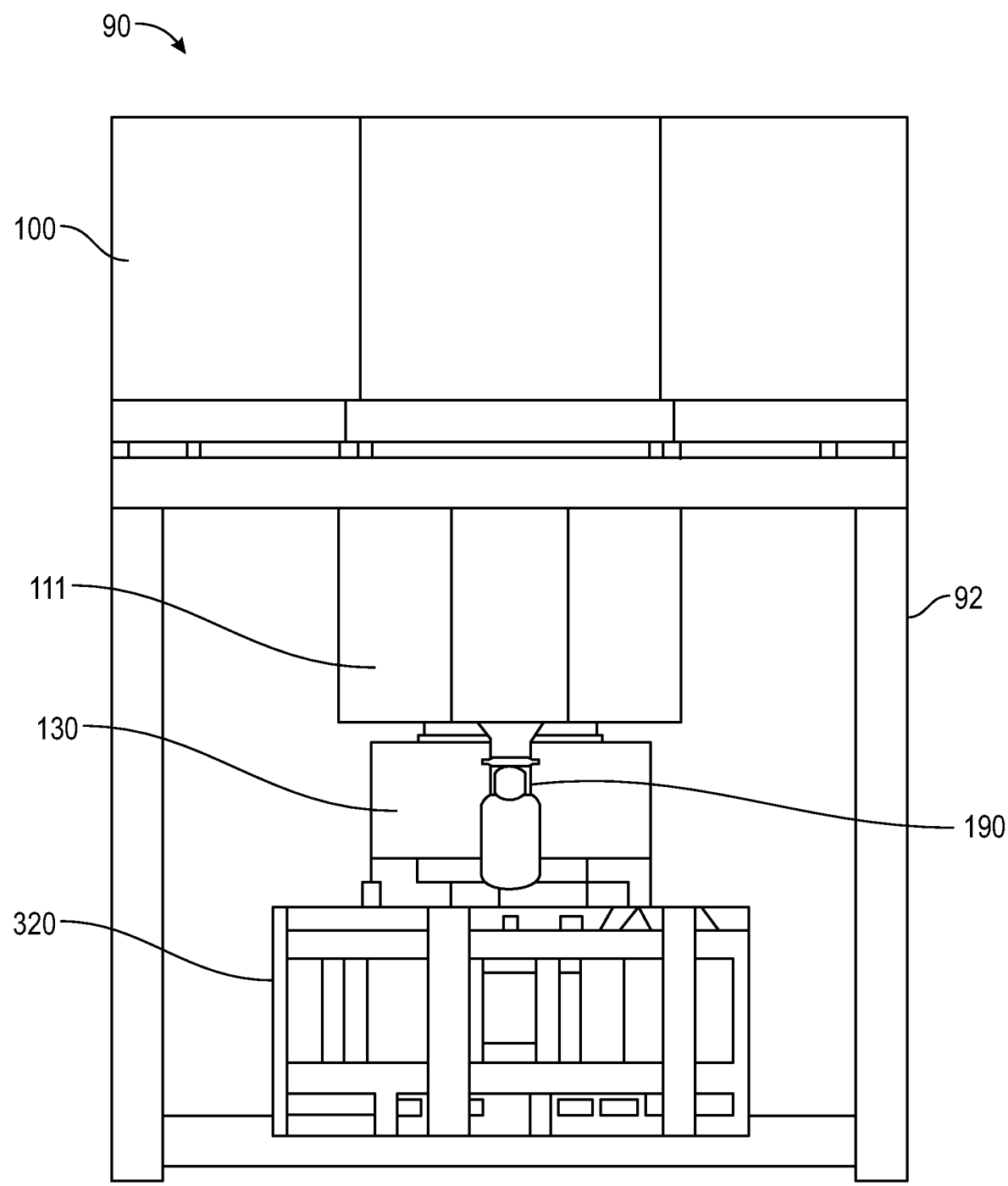
FIG. 3C shows a side view of a processing assembly in accordance with one or more embodiments of the disclosure.

The disclosure provides substrate supports for use with single substrate or multi-substrate (also referred to as batch) process chambers. FIGS. 1 and 2 illustrate a top chamber 100 in accordance with one or more embodiment of the disclosure. FIGS. 3A and 3B illustrate the top chamber 100 having a bellows assembly 101 for maintaining low atmosphere environment within the top chamber 100. FIG. 1 shows the top chamber 100 illustrated as a cross-sectional isometric view in accordance with one or more embodiment of the disclosure. FIG. 2 shows a top chamber 100 in cross-section according to one or more embodiment of the disclosure. FIG. 3A shows the top chamber 100 in cross-section in accordance with one or more embodiment of the disclosure. FIGS. 3B and 3C illustrate a processing assembly 90 comprising the top chamber 100, a support shaft 190, a robot spindle assembly, a stator 130 and a cable management system 320. FIGS. 4 through 9 illustrate the cable management system 320. Accordingly, some embodiments of the disclosure are directed to embodiments of cable management assemblies 320.

The top chamber 100 has a housing 102 with sidewalls 104 and a chamber floor 106. The housing 102 along with the chamber lid 300 define a processing volume 109, also referred to as an interior volume 109.

The processing station 110 illustrated comprises three main components: the chamber lid 300 (also called a lid), a pump/purge insert 330 and a gas injector 112. The top chamber 100 further includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas injectors 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas injectors 112. In the illustrated embodiment, heaters 230 act as the substrate support surfaces and form part of the substrate support 200.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the substrate. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

FIG. 3A illustrates an embodiment where the top chamber 100 further incudes a bellows assembly 101 for mounting the a bottom end (not illustrated) of the support post 190 outside of the interior volume 109 while still maintaining low pressure conditions within the interior volume 109. A top end 105 of the bellows assembly 101 is connected to the chamber floor 106. The chamber floor 106 further includes an opening 120 to allow the support post 190 to pass therethrough. In some embodiments the opening 120 in the chamber floor 106 is concentrically positioned on the rotational axis 211 of the substrate support 200. The rotational axis 211, as can be seen in FIG. 3B, extends in a first direction. The first direction may be referred to as the vertical direction or along the z-axis; however, it will be understood that the use of the term "vertical" in this manner is not limited to a direction normal to the pull of gravity. In some embodiments, a motor 103 is in contact with the chamber floor 106, the motor 103 positioned outside the interior volume 109 of the chamber.

As illustrated in FIGS. 3B and 3C, in some embodiments a robot spindle assembly 111 is in contact with a bottom end (not shown) of the bellows assembly 101. In some embodiments, a fluid union 322 is configured to deliver fluid through the support shaft 190. In some embodiments, the top chamber 100, support shaft 190 and the robot spindle assembly 111 are components of a processing assembly 90. In some embodiments, the processing assembly 90 comprises the top chamber 100, the support shaft 190, the robot spindle assembly 111, a stator 130 and a cable management system 320. In some embodiments, a frame 92 surrounds the support shaft 190, the robot spindle assembly 111, the stator 130 and the cable management system 320. The frame 92 is in contact with the top chamber 100.

Figure 4:
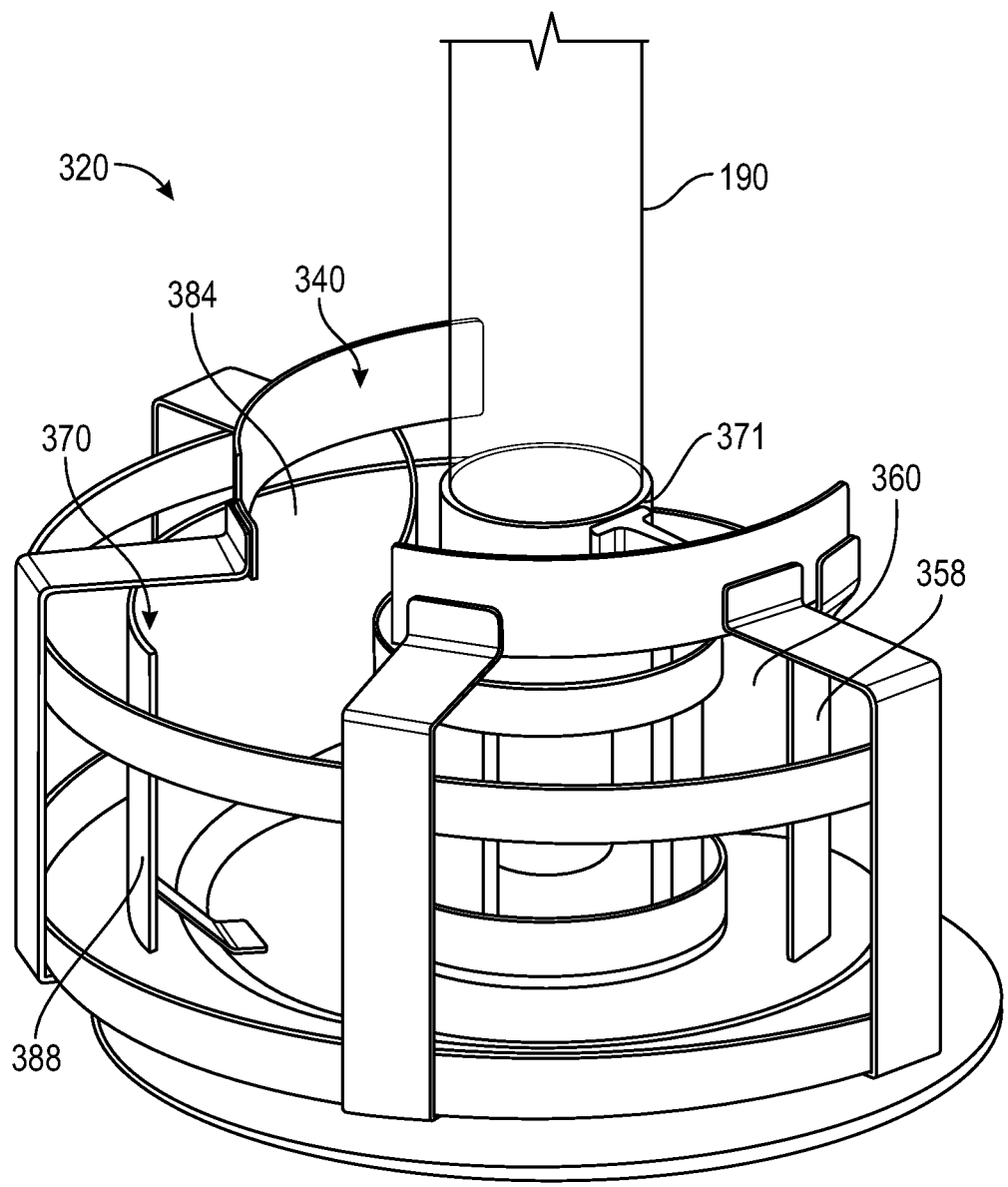
FIG. 4 shows a perspective view of a cable management assembly in accordance with one or more embodiments of the disclosure.

As illustrated in FIG. 4, the cable management system 320 comprises an outer trough assembly 370. The inner trough assembly 370 is positioned within the outer trough assembly 370. The inner trough assembly 370 is configured to receive the hollow support shaft 190 within a shaft coupling 371.

Figure 5:
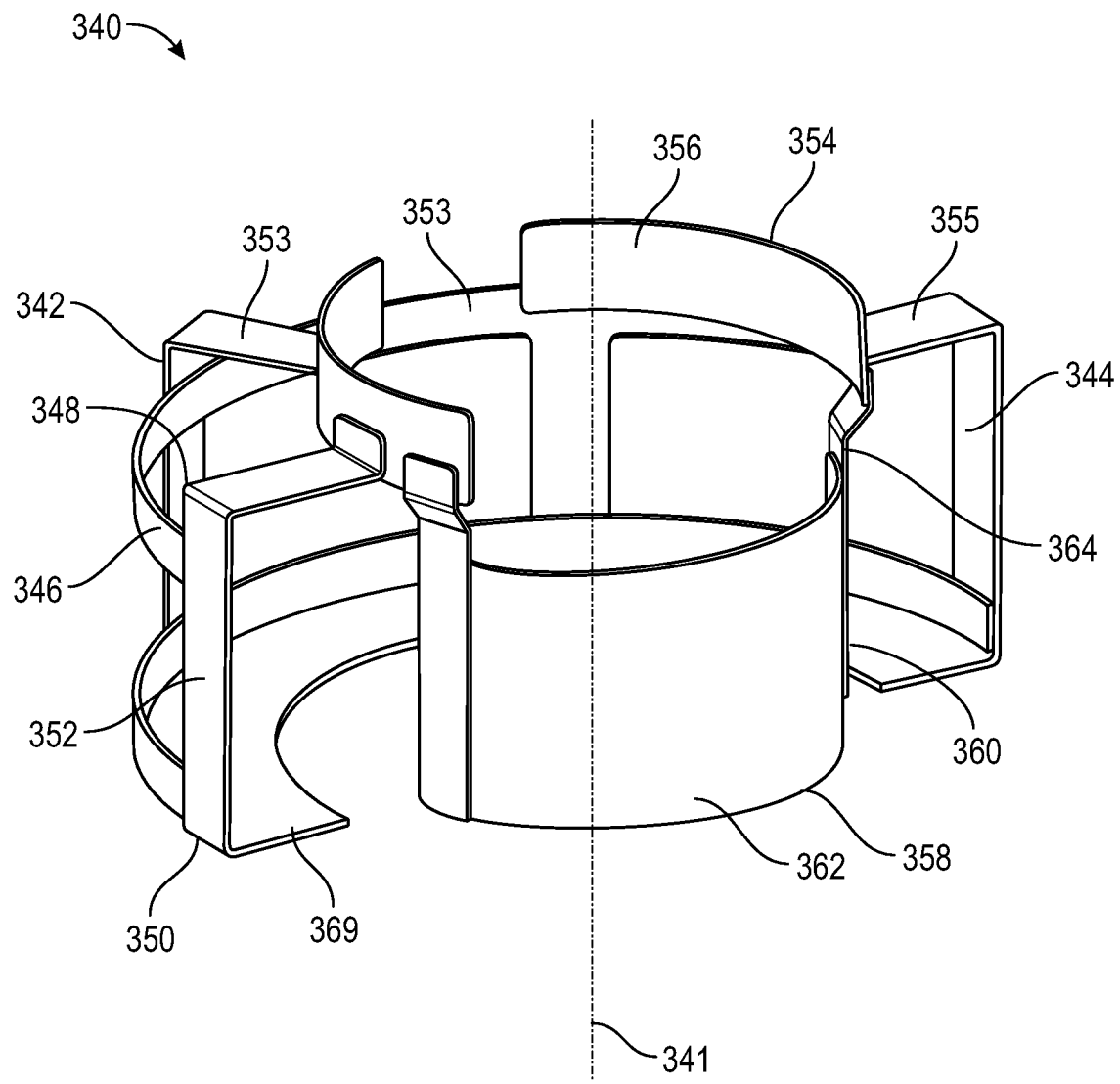
FIG. 5 shows a perspective view of an outer trough assembly in accordance with one or more embodiments of the disclosure.
Figure 6:
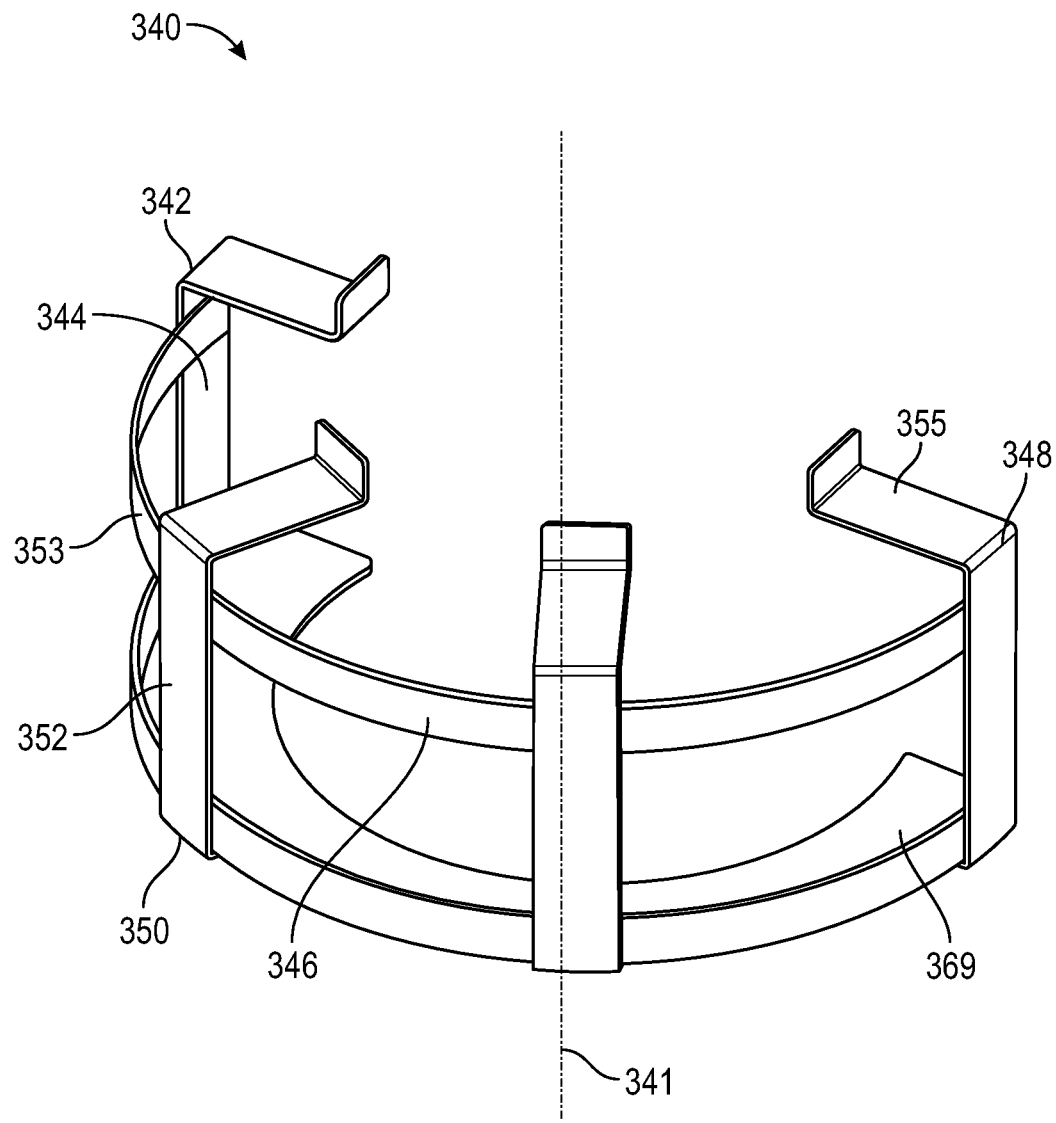
FIG. 6 shows a perspective view of an outer trough assembly in accordance with one or more embodiments of the disclosure.
Figure 7:
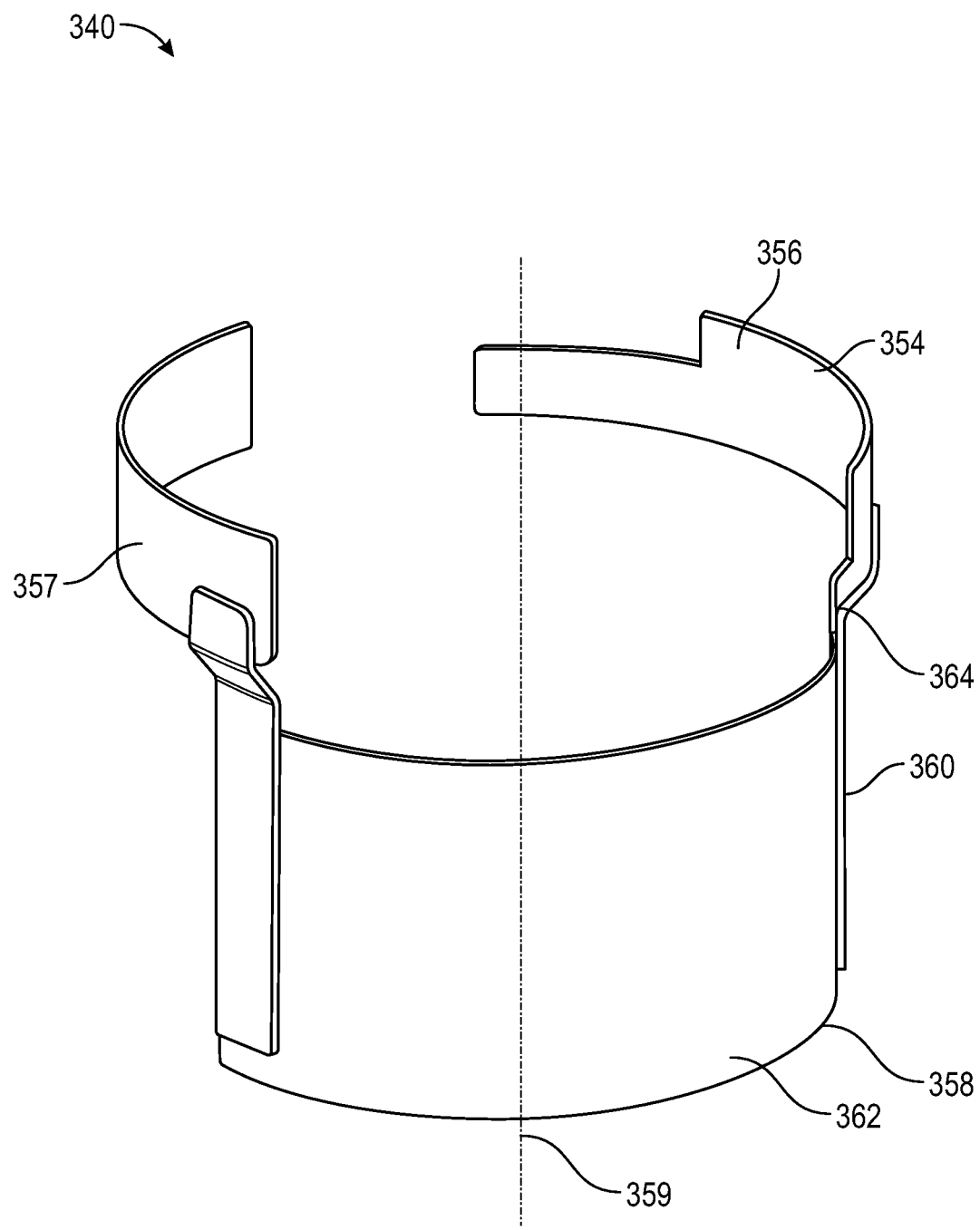
FIG. 7 shows a perspective view of an outer trough assembly in accordance with one or more embodiments of the disclosure.

As illustrated in FIGS. 5 through 7, the outer trough assembly 340 comprises an outer trough boundary 342 having a semi-cylindrical shape with a central axis 341. The outer trough boundary 342 has an inner surface 344, an outer surface 346, a top end 348 and a bottom end 350. As illustrated, the outer trough boundary 342 has a plurality of vertical spines 352 joined by a plurality of horizontal bands 353. The plurality of vertical spines 352 extending from the top end 348 to the bottom end 350. In some embodiments, a sheet having a semi-cylindrical shape is in contact and fully envelopes the plurality of vertical spines 352 and the plurality of horizontal bands 353. In some embodiments, the outer trough assembly 340 further comprises a semi-circular base plate 369 connected to the bottom end 350 of the semi-cylindrical boundary 342. In some embodiments, the base plate 369 extends a distance toward the central axis 341 of the outer trough assembly 340.

The outer trough assembly 340 further comprises a stator bracket 354 having an inner surface 356 and an outer surface 357, the outer surface of the stator bracket 354 being connected to the outer trough boundary 342. The stator bracket 354 has a semi-circular shape. In some embodiments, the stator bracket 354 comprises two semicircular bodies positioned across from each other positioned around the central axis 341 of the outer trough assembly 340. The stator bracket 354 is positioned a radial distance toward the central axis 341 of the outer trough assembly 340, the radial distance of the stator bracket 354 being lesser than a radial distance of the outer trough boundary 342. In some embodiments, the stator bracket 354 is connected to the outer trough boundary 342 by a plurality of horizontal tabs 355. The plurality of horizontal tabs 355 extend from the outer surface 357 of the stator bracket 354 to the top end 348 of the outer trough boundary 342. In some embodiments, the plurality of horizontal tabs 355 is covered by a sheet.

The stator bracket 354 is configured to attach to the stator 130. The stator 130 is enveloped around a rotor. The stator 130 and the rotor are configured to cooperatively interact to cause the inner trough assembly 370 to rotate within the outer trough assembly 340.

The outer trough assembly further comprises an outer guide 358 having a semi-cylindrical shape with a central axis 359, an inner surface 360 and an outer surface 362. The central axis 359 of the outer guide 358 is coaxial with the central axis 341 of the outer trough boundary 342. The outer guide 358 is connected to the stator bracket 354. In some embodiments, the outer guide 358 is connected to the stator bracket 354 with a plurality of vertical tabs 364. The plurality of vertical tabs 364 extend from a bottom surface of the stator bracket 354 to a top surface of the outer guide 358. In some embodiments, the outer guide 358 is the same radial distance from the central axis 359 as the stator bracket. In some embodiments, the outer guide 358 is positioned a radial distance toward the central axis 359, the radial distance of the outer guide being lesser than the radial distance of the stator bracket 354.

Figure 8:
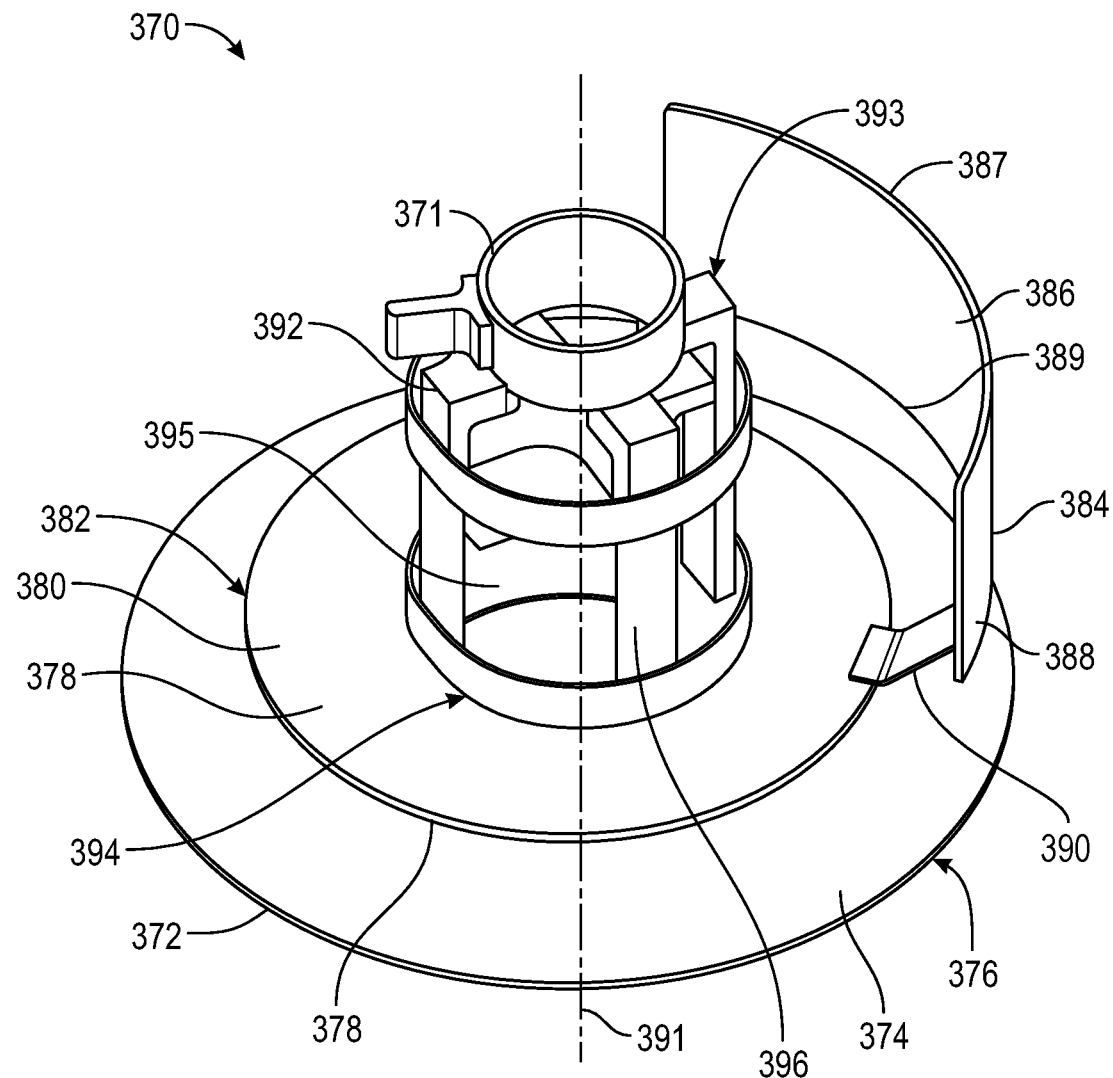
FIG. 8 shows a perspective view of an inner trough assembly in accordance with one or more embodiments of the disclosure.

As illustrated in FIG. 8, the inner trough assembly 370 comprises a bottom plate 372, a base plate 378, an inner guide 384, and a mounting bracket 392.

The bottom plate 372 has a top surface 374 and a bottom surface 376. In some embodiments, the bottom surface 376 of the bottom plate 372 is connected to the frame 92. In some embodiments, a plurality of standoffs connects the bottom plate 372 to the frame 92.

The base plate 378 has a top surface 380 and a bottom surface 382. The bottom surface 372 of the base plate 378 is in contact with the top surface 374 of the bottom plate 372. In some embodiments, a plurality of standoffs connects the bottom plate 372 to the base plate 378.

The inner guide 384 is of a semi-cylindrical shape and is connected to the base plate 378. The inner guide 384 comprises an inner surface 386, an outer surface 388, a top end 387 and a bottom end 389. In some embodiments, the bottom end 389 is connected to the top surface 380 of the base plate 378 with a plurality of tabs 390.

The mounting bracket 392 has a top portion 393, a bottom portion 394, an inner surface 395 and an outer surface 396. The bottom portion 394 is connected to the top surface 380 of the base plate 378. The top portion 393 includes the shaft coupling 371, the shaft coupling configured to receive the hollow support shaft (not shown).

In some embodiments, the shaft coupling 371 comprises a hard stop 375 disposed on an outer surface 373 of the shaft coupling 371. The hard stop 375 is configured to limit rotation of the inner trough assembly 370 relative to the outer trough assembly 340. In some embodiments, the hard stop 375 is configured to limit rotation between 0 degrees to 330 degrees. In some embodiments, the hard stop 375 has a thickness configured to limit rotation between 0 degrees to 330 degrees.

As shown in FIG. 4, positioning the inner trough assembly 370 within the outer trough assembly 340 forms a channel 332. The channel 332 is configured to guide a plurality of chain links (not shown) through the rotational movement of the inner trough assembly 370 relative to the outer trough assembly 340. The channel is formed between the inner surface 360 of the outer guide 358 of the outer trough assembly 340 and the outer surface 388 of the inner guide 384 of the inner trough assembly 370.

Figure 9:
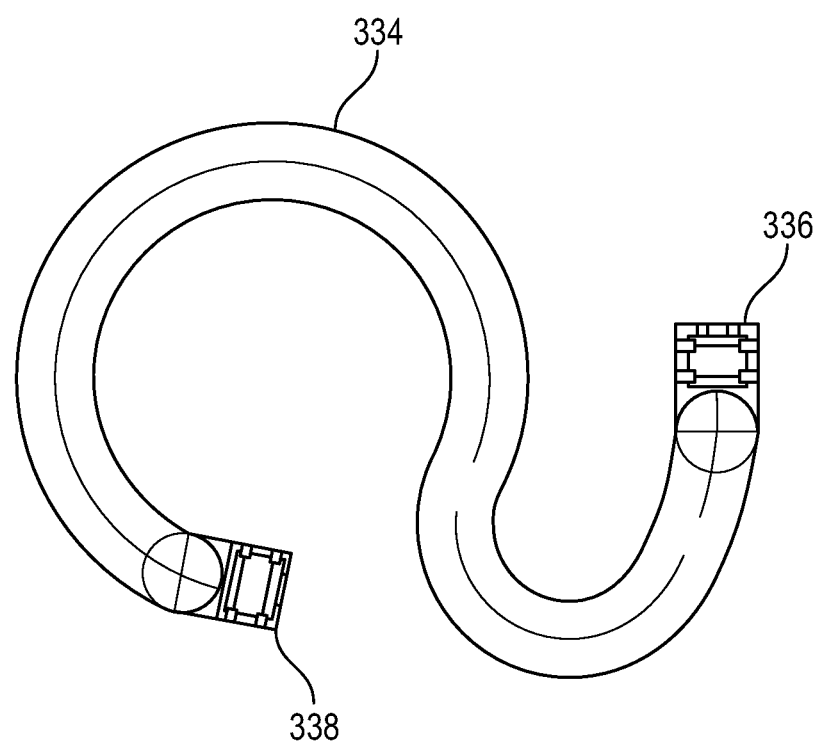
FIG. 9 shows a schematic representation of a plurality of chain links in accordance with one or more embodiments of the disclosure.

FIG. 9 illustrates a top schematic view of the plurality of chain links 334 having a fixed end 336 and a moving end 338. The fixed end 336 is positioned on the outer trough assembly 334, connected to a static position. The fixed end 336 is connected to one or more of a power source, relay or controller. The moving end 338 is connected to the mounting bracket 392 of the inner trough assembly 370 and is configured to rotate with the inner trough assembly 370. The channel 332 guides the plurality of chain links 334 through indexed positions during rotation of the inner trough assembly 370 relative to the outer trough assembly 340.

The plurality of chain links are configured to receive two or more cables within. In some embodiments, the two or more cables are arranged in a side-by-side vertical orientation in a first row such that each of the two or more cables experiences the same bend radius and radius of curvature. In some embodiments, cables of a tighter bend radius are positioned adjacent to the first row of cables in a side-by-side horizontal orientation relative to the first row.

Figure 10:
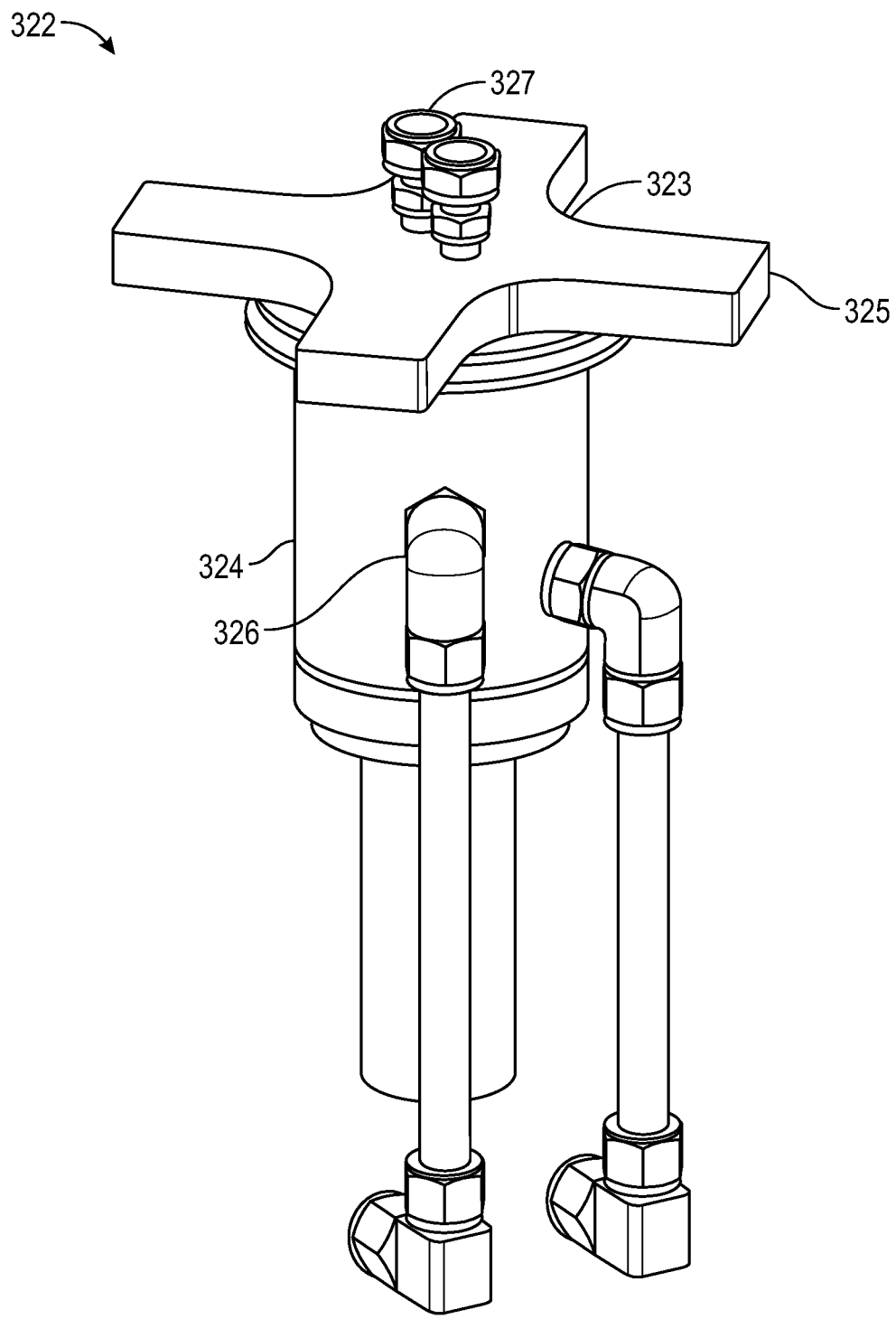
FIG. 10 shows a perspective view of a fluid union in accordance with one or more embodiments of the disclosure; and, FIG. 11 shows a schematic representation of a processing platform in accordance with one or more embodiment of the disclosure.

FIG. 10 illustrates the fluid union 322. The fluid union 322 comprises a cylindrical body having a top portion 323 and a bottom portion 324. The top portion comprises a bracket 325 configured to connect to the mounting bracket 392 of the inner trough assembly 370. The bracket 325 is rotatable relative to the bottom portion 324. The bottom portion 324 comprises one or more fluid inlets 326. The top portion 323 comprises one or more fluid outlets 327. The one or more fluid outlets 327 is configured to deliver fluid to a plurality of fluid tubes (not shown) extending through a cavity of the support post 190.

Figure 11:
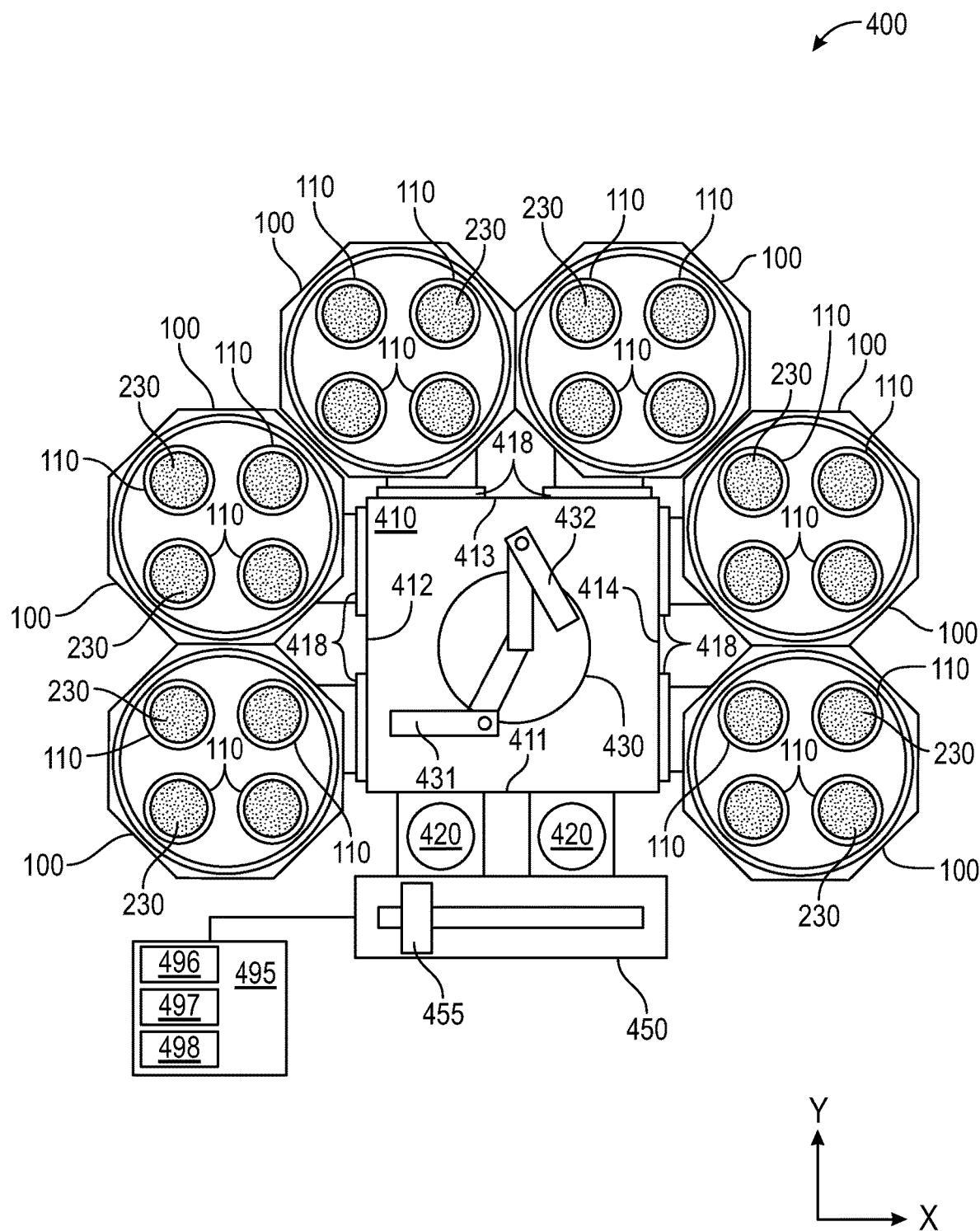

FIG. 11 shows a processing platform 400 in accordance with one or more embodiment of the disclosure. The embodiment illustrated in FIG. 11 is merely representative of one possible configuration and should not be taken as limiting the scope of the disclosure. For example, in some embodiments, the processing platform 400 has a different numbers of one or more of the top chambers 100, buffer stations 420 and/or robot 430 configurations than the illustrated embodiment.

The exemplary processing platform 400 includes a central transfer station 410 which has a plurality of sides 411, 412, 413, 414. The transfer station 410 illustrated has a first side 411, a second side 412, a third side 413 and a fourth side 414. Although four sides are illustrated, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a substrate during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not illustrated) or a fourth arm (not illustrated). Each of the arms can move independently of other arms.

The embodiment illustrated includes six top chambers 100 with two connected to each of the second side 412, third side 413 and fourth side 414 of the central transfer station 410. Each of the top chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of substrates which are processed and returned to the original cassette, or one of the buffer stations may hold unprocessed substrates which are moved to the other buffer station after processing. In some embodiments, one or more of the buffer stations are configured to pre-treat, pre-heat or clean the substrates before and/or after processing.

The processing platform 400 may also include one or more slit valves 418 between the central transfer station 410 and any of the top chambers 100. The slit valves 418 can open and close to isolate the interior volume within the top chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow substrates or cassettes of substrates to be loaded into the processing platform 400. A robot 455 within the factory interface 450 can be used to move the substrates or cassettes into and out of the buffer stations. The substrates or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual top chambers 100, central transfer station 410, factory interface 450 and/or robots 430.

In some embodiments, the top chamber 100 further comprises a controller 495 connected to the plurality of substantially coplanar support surfaces 231 configured to control one or more of the first temperature or the second temperature. In one or more embodiments, the controller 495 controls a movement speed of the substrate support.

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not illustrated) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

Additional embodiments of the disclosure are directed to methods of calibrating the top chamber 100 under vacuum according to one or more embodiment of the disclosure is described. The method comprises the steps of: aligning a top surface of one or more substrate support surfaces 231 located within a interior volume 109 with a chamber lid 300 to establish a process gap, the one or more substrate support surfaces 231 connected to a support post 190 that extends through an opening 120 in the chamber floor 106 and an opening in a support plate 320 attached to a bottom surface 118 of the chamber floor 106; and creating a vacuum environment within the interior volume 109 causing the chamber floor 106 to deflect toward the interior volume 109 while maintaining the process gap. The process gap is between 1 mm and 2 mm.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A cable management system comprising:
an outer trough assembly comprising:
an outer trough boundary having a semi-cylindrical shape with a central axis, an inner surface and an outer surface, and,
an outer guide having a semi-cylindrical shape with a central axis, an inner surface and an outer surface, the central axis of the outer guide coaxial with the central axis of the outer trough boundary; and
an inner trough assembly positioned within the outer trough assembly, the inner trough assembly comprising:
a bottom plate having a top surface and a bottom surface,
a base having a top surface and bottom surface, the bottom surface of the base connected to the top surface of the bottom plate,
an semi-cylindrical inner guide connected to the base, the semi-cylindrical inner guide having an inner surface and an outer surface, the semi-cylindrical inner guide having an axis normal to the base, and
a mounting bracket having a top portion and a bottom portion connected to the base, an inner surface and an outer surface, the top portion having a connector plate and a shaft coupling configured to receive a hollow support shaft, wherein a channel is formed between the inner surface of the outer guide of the outer trough assembly and the inner surface of the outer surface of the mounting bracket.

2. The cable management system of claim 1, further comprising a stator bracket connected to the outer guide.

3. The cable management system of claim 2, wherein the stator bracket is connected to the outer trough boundary.

4. The cable management system of claim 3, further comprising a stator positioned on the stator bracket, and a rotor positioned around the stator and connected to the inner trough assembly, the rotor and stator configured to cooperatively interact to cause the inner trough assembly to rotate within the outer trough assembly.

5. The cable management system of claim 1, wherein the outer trough assembly further comprises a semi-circular base plate connected to a bottom of the semi-cylindrical boundary.

6. The cable management system of claim 1, wherein the inner trough assembly further comprises a hard stop disposed on an outer surface of the shaft coupling, the hard stop configured to limit rotation of the inner trough assembly relative to the outer trough assembly.

7. The cable management system of claim 1, further comprising a plurality of chain links configured to receive two or more cables within.

8. The cable management system of claim 7, the plurality of chain links further comprising a fixed end and a moving end, the fixed end connected to one or more of a power source, relay or controller, the moving end connected to the mounting bracket.

9. The cable management system of claim 8, wherein the channel is configured to guide the moving end of the plurality of chain links relative to the outer trough assembly.

10. The cable management system of claim 7, wherein the plurality of chain links are made of plastic or a polymer.

11. The cable management system of claim 7, wherein the plurality of chain links is configured to account for the mechanical properties of the at least one cable.

12. The cable management system of claim 7, wherein the plurality of chain links is configured to account for bend radius, strain relief and radius of curvature of the at least one cable.

13. The cable management system of claim 7, wherein the two or more cables are arranged in a side-by-side vertical orientation in a first row.

14. The cable management system of claim 7, wherein a second row of two or more cables are positioned adjacent to the first row of cables in a side-by-side horizontal orientation relative to the first row.

15. The cable management system of claim 1, further comprising a hollow shaft extending from the shaft coupling.

16. The cable management system of claim 15 further comprising a rotary fluid union within the mounting bracket configured to deliver fluid to a plurality of fluid tubes extending through the cavity of the shaft.

17. The cable management system of claim 16, wherein the fluid union comprises a top portion and a bottom portion, the top portion comprising a bracket configured to connect to the mounting bracket of the inner trough assembly.

18. The cable management system of claim 17, wherein the bracket is rotatable relative to the bottom portion of the fluid union.

19. A processing assembly comprising:
a top chamber having a at least one substrate support;
a support shaft having a top end and a bottom end, the top end extending through the top chamber, the top end connected to the substrate support;
a robot spindle assembly connected to the top chamber;
a cable management system comprising:
an outer trough assembly comprising:
an outer trough boundary having a semi-cylindrical shape with a central axis, an inner surface and an outer surface, and,
an outer guide having a semi-cylindrical shape with a central axis, an inner surface and an outer surface, the central axis of the outer guide coaxial with the central axis of the outer trough boundary; and
an inner trough assembly positioned within the outer trough assembly, the inner trough assembly comprising:
a bottom plate having a top surface and a bottom surface,
a base having a top surface and bottom surface, the bottom surface of the base connected to the top surface of the bottom plate,
an semi-cylindrical inner guide connected to the base, the semi-cylindrical inner guide having an inner surface and an outer surface, the semi-cylindrical inner guide having an axis normal to the base, and
a mounting bracket having a top portion and a bottom portion connected to the base, an inner surface and an outer surface, the top portion having a connector plate and a shaft coupling configured to receive a hollow support shaft,
a stator connected to a stator bracket, the stator bracket connected to the outer trough boundary of the an outer trough assembly;
wherein a channel is formed between the inner surface of the outer guide of the outer trough assembly and the inner surface of the outer surface of the mounting bracket.

20. A cable management system comprising:
an outer trough assembly comprising:
an outer trough boundary having a semi-cylindrical shape with a central axis, an inner surface and an outer surface, and,
an outer guide having a semi-cylindrical shape with a central axis, an inner surface and an outer surface, the central axis of the outer guide coaxial with the central axis of the outer trough boundary; and
an inner trough assembly positioned within the outer trough assembly, the inner trough assembly comprising:
a bottom plate having a top surface and a bottom surface,
a base having a top surface and bottom surface, the bottom surface of the base connected to the top surface of the bottom plate,
an semi-cylindrical inner guide connected to the base, the semi-cylindrical inner guide having an inner surface and an outer surface, the semi-cylindrical inner guide having an axis normal to the base, and
a mounting bracket having a top portion and a bottom portion connected to the base, an inner surface and an outer surface, the top portion having a connector plate and a shaft coupling configured to receive a hollow support shaft,
a hollow shaft extending from the shaft coupling
a stator bracket connected to the outer guide, the stator bracket connected to the outer trough boundary;

a stator positioned on the stator bracket, and a rotor positioned around the stator and connected to the inner trough assembly, the rotor and stator configured to cooperatively interact to cause the inner trough assembly to rotate within the outer trough assembly;

a plurality of chain links configured to receive at least one cable within; and, a rotary fluid union within the mounting bracket configured to deliver fluid to a plurality of fluid tubes extending through the cavity of the shaft wherein a channel is formed between the inner surface of the outer guide of the outer trough assembly and the inner surface of the outer surface of the mounting bracket;

wherein the outer trough assembly further comprises a semi-circular base plate connected to a bottom of the semi-cylindrical boundary;

wherein the inner trough assembly further comprises a hard stop disposed on an outer surface of the shaft coupling, the hard stop configured to limit rotation of the inner trough assembly relative to the outer trough assembly.

\* \* \* \* \*